United States Patent
Roger et al.

(10) Patent No.: US 7,102,383 B2
(45) Date of Patent: Sep. 5, 2006

(54) METHOD FOR PROGRAMMING/PARALLEL PROGRAMMING OF ONBOARD FLASH MEMORY BY MULTIPLE ACCESS BUS

(75) Inventors: Andre Roger, Voreppe (FR); Charles Aubenas, Grenoble (FR); Julien Fabregues, West Bloomfield, MI (US)

(73) Assignee: STMicroelectronics SA, Montrogue (FR)

( * ) Notice: Subject to any disclaimer, the term of this patent is extended or adjusted under 35 U.S.C. 154(b) by 307 days.

(21) Appl. No.: 10/480,577

(22) PCT Filed: Jun. 12, 2002

(86) PCT No.: PCT/FR02/02013

§ 371 (c)(1),
(2), (4) Date: Dec. 12, 2003

(87) PCT Pub. No.: WO02/101752

PCT Pub. Date: Dec. 19, 2002

(65) Prior Publication Data

US 2004/0153590 A1    Aug. 5, 2004

(30) Foreign Application Priority Data

Jun. 12, 2001    (FR)    ................... 01 07665

(51) Int. Cl.
*H03K 19/177*    (2006.01)
(52) U.S. Cl. .................... 326/39; 365/185.11

(58) Field of Classification Search .......... None
See application file for complete search history.

(56) References Cited

U.S. PATENT DOCUMENTS

| | | | | |
|---|---|---|---|---|
| 4,578,751 A | * | 3/1986 | Erwin | ................ 711/103 |
| 5,329,179 A | * | 7/1994 | Tang et al. | ............... 326/39 |
| 5,473,563 A | * | 12/1995 | Suh et al. | ............ 365/185.13 |
| 6,035,346 A | * | 3/2000 | Chieng et al. | ............. 710/10 |
| 6,236,593 B1 | * | 5/2001 | Hong et al. | ........... 365/185.11 |
| 6,304,485 B1 | * | 10/2001 | Harari et al. | ......... 365/185.09 |

OTHER PUBLICATIONS

Digi International. PCI Technology Overview. Feb. 2003. p. 6. http://www.digi.com/pdf/prd_msc_pcitech.pdf.*

* cited by examiner

*Primary Examiner*—John R. Cottingham
*Assistant Examiner*—Matthew Spittle
(74) *Attorney, Agent, or Firm*—Lisa K. Jorgenson; Jose Gutman; Fleit, Kain, Gibbons, Gutman, Bongini & Bianco P.L.

(57) ABSTRACT

A process of programming or reprogramming a reprogrammable onboard memory (5) comprises programming or reprogramming the onboard memory of several modules (M0, M1) in parallel through a multiple access bus (6) to which the modules are connected. In the case of blank flash memories, a process downloads code through the multiple access bus (6) and executes the code, eliminating all external constraints (such as frequency, binary throughput). The process is more particularly intended to apply to onboard flash type memories.

20 Claims, 1 Drawing Sheet

METHOD FOR PROGRAMMING/PARALLEL PROGRAMMING OF ONBOARD FLASH MEMORY BY MULTIPLE ACCESS BUS

CROSS-REFERENCE TO RELATED APPLICATIONS

This application is the National Stage of International Application No. PCT/FR02/02013 filed on Jun. 12, 2002, which is based upon and claims priority from prior French Patent Application No. 0107665 filed Jun. 12, 2001, the entire disclosure of which is herein incorporated by reference.

BACKGROUND OF THE INVENTION

1. Field of the Invention

The present invention relates to a process for programming and reprogramming any reprogrammable onboard memory in parallel through a multiple access bus such as a bus operating using the CAN (Controller Area Network) protocol, and particularly to program and reprogram onboard flash type memories in parallel.

2. Description of Related Art

The following description is made with reference to a flash type memory, although the concept of the invention can be generalized to any reprogrammable memory.

Note also that the entire description given below is made particularly with reference to the use of a CAN bus. However, the concept of the invention also includes parallel programming/reprogramming of flash memories onboard modules through any other bus with multiple accesses not dedicated to this purpose and that could be used as a substitute for the CAN.

Flash memories are EEPROM memories, where EEPROM is an abbreviation for Electrically Erasable Programmable Read-Only Memory, with a very short write time, a low erase voltage and with high capacity, and are frequently used in microcontroller circuits, particularly circuits dedicated to communication management for different diagnostic tools for an automobile vehicle such as engine control, ABS, electronic suspension management, etc.

The problem that then arises is to program (or reprogram) the onboard memory of these dedicated circuits in a minimum amount of time therefore at low cost.

FIG. 1 shows a conventional functional diagram of a module of the type mentioned above with an on-board flash memory. The core of the circuit is composed of a microprocessor 1. The microprocessor 1 communicates with a system unit in a central computer through an asynchronous serial link 2 of the UART type, where UART is an abbreviation for Universal Asynchronous Receiver-Transmitter. An asynchronous transmission interface 3 is then installed between the microprocessor 1 and the transmission line 2 to enable transmission of data in asynchronous mode. A CAN bus can also be provided to communicate with the microprocessor through a CAN interface 7. The circuit also comprises a chronometer 4 connected to an external oscillator 8 to determine the frequency at which the system runs, and an erasable reprogrammable flash type memory 5. The flash memory is usually shared between a test area 5a and a user area 5b.

In a context in which the flash memories to be programmed are blank, it is important to be able to start the activity of the microprocessor regardless of the frequency conditions under which the system is running and regardless of the transmission speed.

In prior art, the start methodology used to activate the memory is based on the principle of a separation of the flash memory into two parts: the flash test part 5a and the user flash part 5b. Thus, the flash test is programmed in the factory with a minimum program which then loads code through the UART serial link.

However, nowadays the UART serial link reduces the transmission speed which is limited to 9600 bits/s. Therefore this physical interface is not suitable for fast data transfers.

A faster physical link is necessary to enable greater productivity gains on production lines.

Thus, UART type serial links are increasingly being replaced by another communication medium which is the CAN bus, reference 6 in FIG. 1 and which communicates with the microprocessor in this circuit through the CAN interface module 7.

A bus operating according to the CAN protocol can achieve much greater throughputs than are possible with a conventional asynchronous serial link since the different throughputs possible with a CAN bus vary from 125 kilobits/second to 1 Megabit/second, and there is an intermediate rate of 500 kilobits/second.

The problem that then arises is to be able to program blank flash memories using this communication medium and therefore being able to download program code directly through the CAN bus and being able to execute it regardless of the system frequency conditions and regardless of the binary throughput on the link.

Solutions have already been proposed in prior art, particularly the ATMEL company has developed a microcontroller specifically dedicated to applications using a CAN network. However, the solution developed by ATMEL is not completely satisfactory since it requires additional hardware resources, particularly in the CAN module, for error management.

On the contrary, the invention is intended to avoid this disadvantage by implementing additional hardware resources.

It is important to note straight away that the invention is intended to be applicable to a context in which flash memories in all modules to be programmed are blank, in the same way as a context in which the flash memories are not blank, in other words a context in which an identical program is already installed in all modules, and this is the case particularly when a first programming of a test software has been installed in the flash memory and the flash memory then needs to be reprogrammed.

However, in a flash memory reprogramming context, in other words in the context in which an identical program of a test software had already been installed in the flash memory in all the modules, it is necessary to include an erase step before the flash memories can be reprogrammed as required by the user.

The erase step prior to reprogramming takes a lot of time, since it can take about 10 seconds per circuit. This memory erase operation is essential before reprogramming later, and is a severe handicap in a production environment that must produce several hundred of thousands or millions of modules.

Finally, concerning the actual programming of the flash memories in itself, another constraint that has to be taken into account is intrinsic to the component, since programming a flash memory is equivalent to charging capacitors. A flash memory is composed of several small capacitors each provided with a very good quality insulator, such that they hardly discharge over time.

However, the capacitors will discharge more or less quickly depending on the variation of the oxide quality in manufacturing batches. Thus, if the programming of a flash takes x microseconds for a given circuit, it may for example take 1 microsecond longer for another circuit due to variations in the oxide quality.

These synchronization problems that arise between the different modules due to programming of the flash memory and that are intrinsic to the flash memories themselves, are defects that make implementation of a specific programming protocol through the CAN bus unacceptable.

SUMMARY OF THE INVENTION

Thus, one of the purposes of this invention is to overcome constraints related to the flash memory to solve the asynchronism problem due to programming the flash memory, thus enabling programming and parallel reprogramming of onboard flash memories through the CAN bus at the module level.

In a particular context in which the flash memories to be programmed are blank, another purpose of the invention is to start the microprocessor directly through the CAN bus without using additional equipment, regardless of the frequency of the system and regardless of the binary throughput of the data transmission on the CAN bus, while remaining compatible with conventional start-up methodologies used through the UART type serial link. Once it has been made possible to start-up through the CAN bus, it becomes possible to envisage parallel programming of flash memories at the module level.

The principle of the invention described in this application for a CAN bus is nevertheless applicable to all buses of the multiple access type such as for example the new TTP (Time Triggered Protocol) automobile bus, the bus according to the American J1850 standard or the VAN bus.

A specific communication protocol has to be defined for its implementation, to enable simultaneous sending of the same data to all modules for programming and reprogramming of onboard flash memories in parallel.

Advantageously, the existing connections of the modules can be used to pass a unique configuration to each module, to manage asynchronism due to programming the flash memory. Thus, each module can be identified individually, and the programming station can then know how many modules are connected.

As a result, several circuits or modules may be programmed or reprogrammed in parallel, which enables very large productivity gains in production lines and therefore reduced costs.

Therefore the invention relates to a process for programming or reprogramming the onboard reprogrammable memory, characterised in that it consists of programming or reprogramming the onboard memory of several modules in parallel through a multiple access bus to which the said modules are connected.

BRIEF DESCRIPTION OF THE DRAWINGS

Other characteristics and advantages of this invention will become clearer after reading the following description of a particular embodiment with reference to the use of a CAN bus and made with reference to the attached figures, given as a non-restrictive example, in which.

DETAILED DESCRIPTION OF PREFERRED EMBODIMENTS

Figure 1:
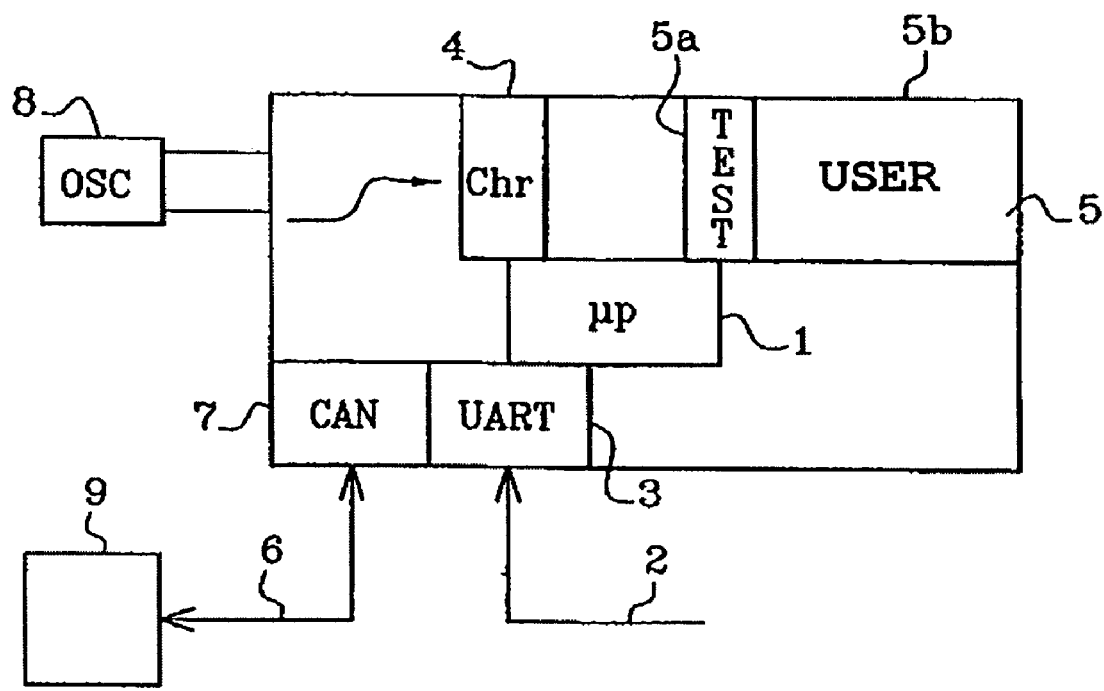
FIG. 1 is a functional diagram of a module containing the flash memory to be programmed.

The integrated hardware resource consisting of the chronometer reference 4 in FIG. 1 is used for everything related firstly to the trigger sequence to be implemented when blank flash memories have to be programmed. The chronometer 4 is activated by a derivative of the internal frequency of the system and its role will be to measure the transmission duration of a predefined frame comprising a predetermined number of binary elements.

The exact binary throughput on the CAN can be precisely calculated by measuring the transmission duration for a number of transitions through the internal frequency of the system. Thus, the microprocessor 1 can be adapted to the frequency of the CAN. The CAN module 7 of the circuit is then configured to actively participate in the communication.

Therefore, a first phase will consist of detecting the binary throughput on the CAN.

Detection of the binary throughput is based on the measurement in time of a predefined frame transmitted on the CAN by a programming station 9. During the measurement time, the CAN module 7 in the circuit is not active. Detection will actually take place at the circuit input/output ports. Thus, the microprocessor will receive and analyse the frame predefined through the input/output ports (not shown in FIG. 1) instead of working directly with the CAN module.

The microprocessor measures the transmission time on a reference frame comprising a large number of bits, preferably 29 bits, in order to obtain a good resolution. An attempt is made to have the largest possible number of bits, while making sure that the software has a small number of transitions to check. If there are more than 29 bits, there are many transitions and it then becomes more difficult to monitor the transitions with the software at any frequency.

The equivalent binary throughput is then calculated by the microprocessor 1, so that the CAN module 7 can be configured correctly and therefore a predefined identification frame valid on the CAN bus 6 acting as an acknowledgement of reception can be sent to the programming station 9 through the CAN module 7.

A second phase then consists of downloading the loading program.

In order to achieve this, the programming station 9 will send a predefined number of bytes, typically 32 bytes, on the CAN bus 6 to the microprocessor 1 through the CAN module. According to one particular embodiment, a larger number of bytes, for example 64, is loaded in order to reinitialise the CAN module with the final optimum parameters of the CAN. Transferring the final parameters of the CAN in this way with the bytes that were downloaded in the microprocessor makes the process more robust.

The microprocessor will then load these bytes into its internal memory, which is a RAM (Random Access Memory) type volatile memory. Once the microprocessor has written a sufficient number of bytes into the RAM, it will execute the program that has just been loaded and will send a predefined frame signifying the end of the second phase, this acknowledging reception of bytes at the programming station through the CAN module.

Thus, a program embryo has been successfully loaded and is completely configurable. Advantageously, this program embryo is a loading program that can subsequently be used to load a much larger number of bytes.

Thus in a third phase, a final application may be downloaded from the programming station into the microprocessor RAM. For example, this final application may be software for programming the flash memory.

Therefore to start, an initial program to load the internal memory of microprocessors for each module was downloaded through the CAN bus following prior detection of the binary throughput on the CAN at the module.

Once the system has been started through the CAN bus, it becomes possible to start programming and to erase flash memories in parallel through the CAN bus.

Figure 2:
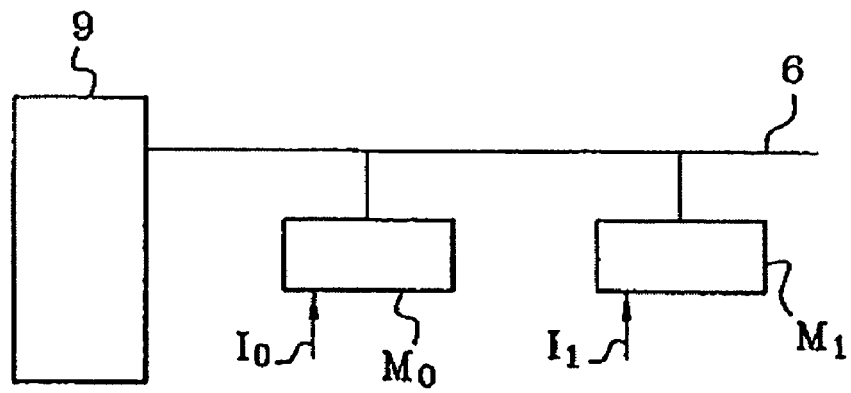
FIG. 2 shows an example of the hardware configuration of a module programming bench.

Thus on FIG. 2, only two modules to be programmed (or reprogrammed), M0 and M1, are shown as an example. However, it is clear that the invention is intended for use with several modules. Modules M0 and M1 communicate with the programming station 9 through the CAN bus 6. All modules connected to the CAN bus operate at the same frequency and using the same software.

Thus, initially, the user must read the predefined input and output statuses of the modules in order to define an identifier specific to the module which will subsequently be used to communicate with the programming station through the CAN. In order to achieve this, the existing connections of the modules, I0 and I1 respectively, are used to supply a binary identification number in the test environment that will be read by the module microprocessor to identify itself with the programming station.

Another approach to enable each module to have a unique identifier (condition necessary for parallel programming) is to power up all modules in sequence and then start them in sequence. The programming station can then give an identifier to the module when it is started.

It then asks the module to start waiting for a specific end of sequence message. The station then continues to apply power to and to trigger subsequent modules. When this phase is finished, it sends the end of sequence message: all modules then have a different identifier and are ready to accept broadcast type messages.

Two message types are distinguished in the communication protocol according to the invention. Firstly, there are "broadcast" type messages, in other words information is broadcast to all modules connected on the CAN bus. These "broadcast" type messages are therefore general broadcast messages sent by the programming station and which are listened to simultaneously by all modules in parallel. Thus, programming, erase and verification commands are broadcast from the programming station. These commands are broadcast with a generic identifier that distinguishes these "broadcast" type commands.

There are also point to point type messages through identifiers specific to each module which are either messages from the programming station to a particular module, or messages from a module to the programming station.

Therefore, the invention includes a set of rules that cover the functional characteristics of the data transmission link, and data transmission procedures for programming/reprogramming the flash memories in parallel.

In a first step, the programming station counts how many modules are connected to the bus. The programming station actually requests modules to identify themselves and to send their identification frame, through a "broadcast" type command.

In a second step, the programming station then broadcasts programming commands to all modules in parallel (or an erase command in the case of reprogramming). These programming commands are interpreted as being of the "broadcast" type due to the generic identifier with which they are associated, and comprise a write address and data to be programmed.

Optionally, when programming is terminated, the programming station repeats the same procedure and broadcasts a check command, once again to be sent to all modules. Thus, each module uses a single "broadcast" type message that includes the address and the reference data, to carry out a self-check using its microprocessor, by comparing the contents of its own flash memory with the reference that it received. Therefore, the checks are made in parallel, thus saving a large amount of time.

According to one particular embodiment, at the end of the sequence, the programming station requests each module to send the results of programming and the check. Each module saves its errors while it is being programmed or while it is checking.

The programming station may then count how many modules have been programmed, still using a "broadcast" type command.

However according to another embodiment, each module can immediately signal its errors to the programming station as soon as it has detected an error during programming or during the verification, using point to point messages provided for this purpose.

Furthermore, depending on the type of the user's hardware, it may be advantageous to use an output from the module to control external indicators such as LEDs (Light Emitting Diodes), the function of which is to indicate the result of the programming on the programming bench.

Starting from two modules to be programmed in parallel, a large amount of time can be saved compared with programming of flash memories using the UART. This time saving is even more significant if an erase step has to be implemented. For example, this is the case particularly when it is required to load a test program that will then be erased before programming the required application.

Therefore, the protocol is intended to minimize software processing necessary in the module such that the module microprocessor spends more time programming than managing the communication with the programming station.

In order to achieve this, a double buffer system is set up to simultaneously enable data reception and programming in memory. Thus, initially, the programming commands received from the CAN are put into a first buffer area acting as a waiting area.

Then, on reception of a transfer buffer and programming command from each of the modules, programming of the flash memory begins in each module using the data stored in the first data buffer area that up to then had been in reception, and simultaneously a second buffer area is assigned to reception of commands from the CAN. Therefore, there is a first process to fill a data buffer and another process to process these data. The changeover from one process to another means that modules can be programmed very efficiently with minimum communication, and therefore an optimum time saving.

Large buffers have to be used to further minimize software processing necessary in the module for processing of communications between the module and the programming station. The changeover from one buffer to another is made by a transfer command sent from the programming station to the module. Similarly, each module will send a report message to the programming station when it has finished programming the buffer.

We will now see details of all commands included in the protocol according to the invention.

The protocol enables programming of the flash memory in parallel through the CAN bus, and therefore the first step is to use a number of "broadcast" type commands, in other words commands broadcast from the programming station to all modules connected on the CAN bus, and any of the modules can receive them.

A first send_ID command consists of asking modules to send their identifier. Therefore each module must send its identifier specific to it, which will enable the programming station to count the number of modules that are connected to it through the CAN bus and to monitor them individually.

Another "broadcast" type command is the start filling buffer command. This command is made by sending a start memory address, count and data to be written into the memory at the said address, on the CAN to all modules. For example, the count is used to inform the module about how many binary words it will receive after receiving the filling buffer command.

Subsequently, continue filling buffer commands are broadcast consisting only of data, and the memory address automatically increments itself. Thus, it is possible to minimize the number of auxiliary bits to be transmitted and therefore the data transmission time.

Therefore each module receives data until it receives a new start filling buffer command, or until it receives a transfer buffer command or a programming command at the initiative of the programming station.

The transfer buffer and programming command consists of requesting each module to start programming starting from the buffer that was in data reception and to allocate the other buffer to reception. Thus, the buffer that was in reception becomes the buffer that will be used as reference for programming, and the buffer that was in programming becomes the reception buffer.

The command that follows the transfer buffer and programming command described above is the transfer buffer and verification command which is also a "broadcast" type command. On reception of this command, each module starts the verification starting from the buffer that was in reception, and the other buffer is then allocated to reception. Therefore, the verification takes place starting from a single command broadcast to all modules at the same time and each module checks the result of its programming by itself. Therefore, this is a "broadcast" type of verification, inducing a large time saving for the entire process.

The start filling buffer and the continue filling buffer commands are actually independent, as are the programming and verification commands. It is only when buffers are transferred that a notification is made about whether the transfer command is to program or to verify.

The protocol includes another command broadcast by the programming station to all modules, that consists of asking for information to be sent about the status of each module. Each module then sends its programming status, for example after verification.

Finally, a last broadcast command is necessary, which is the erase command. The erase command is broadcast by the programming station on the CAN bus to which all modules are connected, and controls starting to erase memory in all modules at the same time. This command is used particularly for parallel reprogramming of flash memories through the CAN bus.

Depending on the implementation chosen for the protocol, the erase command is preferably used in two steps for better security. Thus, a first Prepare erase command consists of transferring data banks to be erased into the flash memory as parameters, followed by a second command to confirm the erase consisting of executing the previous command. Obviously, the confirm erase command can be optional.

The protocol according to the invention also uses a certain number of specific messages from modules to the programming station. Therefore, these are no longer "broadcast" type messages as above, but point to point type messages.

Specific identifiers are necessary for each of the above mentioned types of messages, so that communication is possible between each of the modules and the programming station.

A global identifier on the CAN is a an identifier of the type with at least 11 bits. Some of these bits define the command type and others define the module number. In this case, the specific identifiers to be used on the CAN bus are derived from a logical combination between generic identifiers allocated for each command and the identifier specific to the module, so that a unique identifier is sent on the CAN for each message from a module to the programming station.

One important command to be included among the specific point to point commands from modules to the programming station is the command_OK command. The command_OK command is sent by each module to the programming station after a successful programming/verification of its data buffer (or after a successful erase).

Advantageously, since some asynchronism has to be managed due to programming of its flash memories, the programming station starts a timeout so as to leave sufficient time for each module to correctly program (or verify) its memory. After a given time predefined by the programming station, the programming station returns an individual command using the unique identification for each module, to all modules that did not reply, to notify them that they are in an error status.

However, available point to point commands from modules to the programming station may also include a programming error command. Thus, when a module detects an error during programming (for example when it cannot write a value), this programming error command enables it to signal this error to the programming station immediately, without waiting for the end of the timeout.

Similarly, a verification error command is provided that gives each module an opportunity to report a verification error to the programming station immediately that it detects it, rather than at the end of the verification process.

The programming station starts the timeout and waits until all modules have returned either the command_OK command or an error message.

These programming error and verification error commands sent as soon as an error is detected actually optimise programming times. As a result of these different commands, the programming station does not need to wait for the end of the timeout to deal with any errors. Once again, this is made possible by the unique identifier allocated to each module connected onto the CAN bus.

In the case of an erase for subsequent reprogramming of the flash memory, an erase error command can also be used based on the same principle and with the same purpose as the programming error and verification error commands used during parallel programming of the different modules.

One last specific point to point command from the modules to the programming station is the module status command. This command is sent by each module in response to a request (of the "broadcast" type) from the programming station for this purpose.

The protocol according to the invention also includes specific commands from the programming station to modules. Therefore, it is another point to point command.

In the same way as for specific commands from modules to the programming station, specific identifiers have to be generated on the CAN so that each module can know if the message concerns it. To achieve this, the generic identifiers that are used for the different required commands will be particularized by adding the specific index for the module to which the command is addressed at the end of each generic identifier, thus enabling the point to point communication and consequently transmission of specific messages from the programming station to the modules.

These specific messages from the programming station to the modules include the send status command that consists of requesting a module to send its status.

A stop command consists of requesting a module to stop all operations immediately. This command can prevent modules that contain flash memory programming errors from disturbing the programming of the other modules.

A stop timeout command in the form of a specific module to programming station message, for example of the command_OK command type described above, notifies modules from which the response is expected that the timeout set in the programming station has terminated. When it receives this stop timeout command, the module in question must consider itself in error.

An operation_OK command must be given at the end of the programming or verification (or at the end of the erase when a parallel reprogramming process is used). This point to point operation_OK command is necessary because the programming station provides the guarantee that everything took place correctly in a specific module. The programming station provides the final confirmation to each module that it is correctly programmed, even if the programming station uses a "broadcast" type command described above in the description to delegate the verification of the programming to each module, with each module subsequently transferring the result of its verification to the programming station.

The module may advantageously use reception of this operation_OK command to command a light emitting diode on one of the existing output ports on the module.

Thus, from a protocol point of view, the programming station checks that it has actually received all acknowledgements of reception from each module and then uses the operation_OK command to notify that everything took place correctly throughout the process to each specific module.

After describing all specific "broadcast" type commands included in the protocol according to the invention, we will now consider an example of a programming and verification stream using these different commands. All commands transit on the CAN bus independently of where they are sent from.

Therefore, a first step uses the send_ID command sent by the programming station, and each module replies to it by sending its specific identifier.

A second step consists of sending the start filling buffer command, which marks the beginning of reception on a buffer. In a third step, the continue filling buffer command is sent on the CAN, with the result of continuing to fill the buffer with the addresses being incremented.

A fourth step uses either continue filling buffer commands or a new start filling buffer command in the case in which there is a discontinuity in the data addresses to be programmed.

The transfer buffer and programming command is sent in a fifth step. Programming then begins in each module starting from the buffer that was in reception, and the second buffer is simultaneously allocated in reception. The transfer buffer and verification command can also be used during this step, a verification is then started and this verification takes place in each module in parallel, as already explained.

A sixth step consists of repeating the filling buffer commands. Thus, steps 2 to 5 are repeated until the end of the programming process.

In a seventh step, each module in parallel then sends either the command_OK command which indicates that the data in the last buffer were successfully processed, or the programming error command that indicates an error during programming, or the verification error command that indicates an error during the verification.

The eighth step consists of sending the stop timeout command, from the programming station. This command terminates the timeout used in the programming station that comes in the time period during which the modules have to carry out their programming. Modules that receive this stop timeout command must consider themselves in error.

Finally, the last step in the programming and verification process consists of sending the operation_OK command. The programming station can then use this command to confirm individually to each module that everything took place correctly throughout the entire process.

The command stream on the CAN is simpler if flash memories of modules are erased in order to do parallel reprogramming.

A first step consists of using the send_ID command, each module replies by sending its specific identifier, and the programming station can then count the number of modules to be erased.

The erase preferably takes place in two steps using two "broadcast" type commands: firstly a prepare erase command and secondly a confirm erase command.

The modules then send either a command_OK type command indicating that they correctly executed the erase command, or an erase error command.

The operation_OK command is sent if all modules completed the erase successfully. With this command, the programming station specifically confirms that the erase was successful to each module. Therefore this command is sent in response to the command_OK command output from the modules.

Finally, the stop timeout command is used in the last step. Therefore, modules that did not reply during this timeout and which receive this command must go into the error status.

Therefore, the protocol according to the invention defines rules for writing software that will enable parallel programming of a blank or non-blank on board flash memory of several modules through the bus to which the modules are connected. This protocol can be defined by the use of existing module input/output ports to transfer a unique configuration to each module. A logical combination can then be made between identifiers allocated to the CAN bus for command types and identifiers specific to each module to make communication according to the protocol possible.

In the case of blank flash memories, the invention also defines a process to download program code through the bus and to execute it, eliminating all external constraints (frequencies, binary throughput).

The example embodiment that has just been described is given with particular reference to the use of a CAN bus. However, the invention is not restricted to the use of a CAN bus and any other multiple access bus not dedicated to this purpose may be used in parallel programming of flash memories onboard a module. To achieve this, all that is necessary is that the bus concerned is accessible in parallel, either inherently or because the protocol has been modified in a manner known in itself so that it becomes accessible in parallel (bus access conditions, redefinition of message headers to enable "broadcast" type messages . . . ).

As already mentioned, the process according to the invention as described with reference to the example use of the CAN bus is actually applicable to any type of multiple access bus such as the new TPP automobile bus, the bus according to the American J1850 standard, the VAN bus, etc.

What is claimed is:

1. A process for programming or reprogramming an onboard reprogrammable memory, comprising:
   programming or reprogramming an onboard memory of each module of a plurality of modules in parallel, using a multiple access bus to which each module of the plurality of modules is connected;
   communicating according to a communication protocol on the multiple access bus
      using broadcast type commands to broadcast to all modules of the plurality of modules, and
      using point to point type commands, the point-to-point type commands comprising:
         specific commands from modules to the programming station, and
   specific commands from the programming station to the modules, wherein the broadcast type commands are broadcast on the multiple access bus with a generic identifier that distinguishes them.

2. The process according to claim 1, further comprising:
   supplying a binary identifier that is specific to each module of the plurality of modules in a test environment using the existing connections to the multiple access bus for each module of the plurality of modules, so that each module can identify itself with a programming station, through the multiple access bus.

3. The process according to claim 1, further comprising:
   generating specific identifiers on the multiple access bus for transmitting point-to-point type commands.

4. The process according to claim 3, wherein the specific identifiers on the multiple access bus are derived from a logical combination between generic identifiers allocated for each command and an identifier specific to each module of the plurality of modules.

5. The process according to claim 1, wherein when the onboard memory of the modules to be programmed is not blank, the memory of all modules of the plurality of modules is erased substantially at the same time in response to a broadcast type command being broadcast on the multiple access bus.

6. The process according to claim 5, wherein the broadcast type command is an erase memory command, and wherein the erase memory command being broadcast in parallel on the multiple access bus is used by each module of the plurality of modules in two steps comprising:
   transferring data banks to be erased in the onboard memory of each module, as parameters, and
   confirming the erase by executing a previous command at each module.

7. The process according to claim 1, further comprising:
   using a double buffer system in the communication protocol to enable simultaneous data reception and programming in the memory of each module of the plurality of modules.

8. The process according to claim 1, further comprising:
   checking in parallel that the programming has been made in each module of the plurality of modules by using a broadcast type command.

9. The process according to claim 8, wherein the broadcast type command is a verification command, and wherein the verification command comprises an address and a reference data, each module of the plurality of modules self checking itself through its microprocessor by comparing the contents of its own memory with the received reference.

10. The process according to claim 1, wherein prior to programming being performed in a context in which the onboard memories to be programmed are blank, comprises:
    starting a microprocessor on each module of the plurality of modules directly through the multiple access bus, regardless of frequency that an external system coupled to the onboard memory is running, and regardless of binary data throughput on the multiple access bus.

11. The process according to claim 10, wherein the starting a microprocessor further comprises:
    detecting the binary throughput on the multiple access bus;
    downloading a loading program into the internal memory of the microprocessor on each module of the plurality of modules; and
    downloading a final application into the internal memory of the microprocessor on each module of the plurality of modules.

12. The process according to claim 11, wherein the detecting the binary throughput comprises:
    making a time measurement of a predefined frame transmitted on the multiple access bus comprising a sufficient number of binaries to obtain good precision; and
    calculating the equivalent binary throughput.

13. The process according to claim 11, wherein the downloading a loading program into the internal memory comprises:
    sending a sufficiently large predefined number of bytes on the multiple access bus to the microprocessor on each module of the plurality of modules to transfer the final optimum parameters for the multiple access bus at the same time.

14. The process according to claim 1, wherein the multiple access bus comprises a CAN bus.

15. The process according to claim 1, wherein the multiple access bus comprises a TPP bus.

16. The process according to claim 1, wherein the multiple access bus comprises a bus according to the American J1850 standard.

17. The process according to claim 1, wherein the multiple access bus comprises a VAN bus.

18. A process for programming or reprogramming an onboard flash memory, comprising:
    programming or reprogramming an onboard flash memory of each module of a plurality of modules in parallel, using a multiple access bus to which each module of the plurality of modules is connected; and
    communicating according to a communication protocol on the multiple access bus
       using broadcast type commands to broadcast to all modules of the plurality of modules, and
       using point to point type commands, the point-to-point type commands comprising:
          specific commands from each module of the plurality of modules to the programming station, and
    specific commands from the programming station to each module of the plurality of modules.

19. The process of claim 18, wherein the multiple access bus comprises at least one of a CAN bus, a TPP bus, a bus according to the American J1850 standard, and a VAN bus.

20. The process of claim 18, further comprising:
supplying a binary identifier that is specific to each module of the plurality of modules in a test environment using the existing connections to the multiple access bus for each module of the plurality of modules, so that each module can identify itself with a programming station, through the multiple access bus.

* * * * *